US009055360B1

(12) United States Patent
Johnson

(10) Patent No.: US 9,055,360 B1
(45) Date of Patent: Jun. 9, 2015

(54) SONIC PROJECTOR SYSTEM

(71) Applicant: Joseph W Johnson, Bronx, NY (US)

(72) Inventor: Joseph W Johnson, Bronx, NY (US)

( * ) Notice: Subject to any disclaimer, the term of this patent is extended or adjusted under 35 U.S.C. 154(b) by 0 days.

(21) Appl. No.: 14/246,347

(22) Filed: Apr. 7, 2014

(51) Int. Cl.
*H04R 1/20* (2006.01)
*H04R 1/02* (2006.01)
*H05K 5/00* (2006.01)

(52) U.S. Cl.
CPC .......... *H04R 1/025* (2013.01); *H04R 2201/025* (2013.01)

(58) Field of Classification Search
CPC .......... H04R 1/023; H04R 1/025; H04R 1/26; H04R 1/342; H04R 1/345; H04R 1/403; H04R 1/2811; H04R 1/2819; H04R 1/2826; H04R 1/2842; H04R 5/02
USPC .................................. 381/160, 345; 181/155
See application file for complete search history.

(56) References Cited

U.S. PATENT DOCUMENTS 3,582,553 A * 6/1971 Bose ............................ 381/345
3,819,006 A * 6/1974 Westlund ...................... 181/155
4,073,365 A 2/1978 Johnson

* cited by examiner

*Primary Examiner* — Brian Ensey
(74) *Attorney, Agent, or Firm* — Dwayne L. Bentley; DL Bentley Law Group PLLC

(57) ABSTRACT

A sonic projector system is disclosed. The sonic projector system includes: a left speaker cabinet system having a left sound projection component configured to project sound; a right speaker cabinet system having a right sound projection component configured to project sound; and a screen configured to receive the projected sound from the left speaker cabinet system and the projected sound from the right speaker cabinet system, where the screen includes a middle portion that receives and transforms the projected sound from the left speaker cabinet system and the projected sound from the right speaker cabinet system to a combined projected sound, where the screen is configured to distribute the combined projected sound to a specific area.

7 Claims, 5 Drawing Sheets

SONIC PROJECTOR SYSTEM

FIELD OF THE INVENTION

The present invention relates to a sonic projector speaker system and more particularly to speaker systems having multidirectional sound characteristics.

BACKGROUND OF THE INVENTION

Generally, various speaker systems have been devised heretofore with the object of producing multidirectional sound characteristics, the configuration of the present invention provides an advantageous arrangement that is inexpensive to manufacture and assemble while providing high fidelity and multidirectional sound radiation characteristics in a structure having an inherently pleasing and utilitarian appearance.

Often when multiple speakers are used to emit sound from an amplifier connected to a record player, dvd player or cd player the sound is directed and dispersed in multiple directions. Even though the sound is emitted in multiple directions, a clear sound is not emitted from the speakers because there are no components that direct the sound from the multidirectional speakers in a specific direction.

Therefore, there is a need for a multidirectional speaker system that enables one to control the sound emitted through the system that provides optimum sound to the person listening to the multidirectional speaker system.

SUMMARY OF THE INVENTION

The present invention has been accomplished in view of the above-mentioned technical background, and it is an object of the present invention to provide a system for projecting sound.

In a preferred embodiment of the invention, a sonic projector speaker system is disclosed. The sonic projector speaker system includes: a left speaker cabinet system configured to project sound; a right speaker cabinet system configured to project sound; and a screen configured to receive the projected sound from the left speaker cabinet system and the projected sound from the right speaker cabinet system, where the screen includes a middle portion that receives and transforms the projected sound from the left speaker cabinet system and the projected sound from the right speaker cabinet system to a combined projected sound, where the screen is configured to distribute the combined projected sound to a specific listener.

In another preferred embodiment of the invention, another sonic projector speaker system is disclosed. A left speaker cabinet system is configured to project sound. A right speaker cabinet system is configured to project sound. A screen is configured to receive the projected sound from the left speaker cabinet system and the projected sound from the right speaker cabinet system, wherein the screen includes an optional vertical triangle that receives and augments the projected sound from the left speaker cabinet system and the projected sound from the right speaker cabinet system to a combined projected sound, wherein the screen is configured to distribute the combined projected sound to a specific area.

BRIEF DESCRIPTION OF THE DRAWINGS

These and other advantages of the present invention will become more apparent as the following description is read in conjunction with the accompanying drawings, wherein.

DETAILED DESCRIPTION OF THE INVENTION

The presently preferred embodiments of the invention are described with reference to the drawings, where like components are identified with the same numerals. The descriptions of the preferred embodiments are exemplary and are not intended to limit the scope of the invention.

Figure 1:
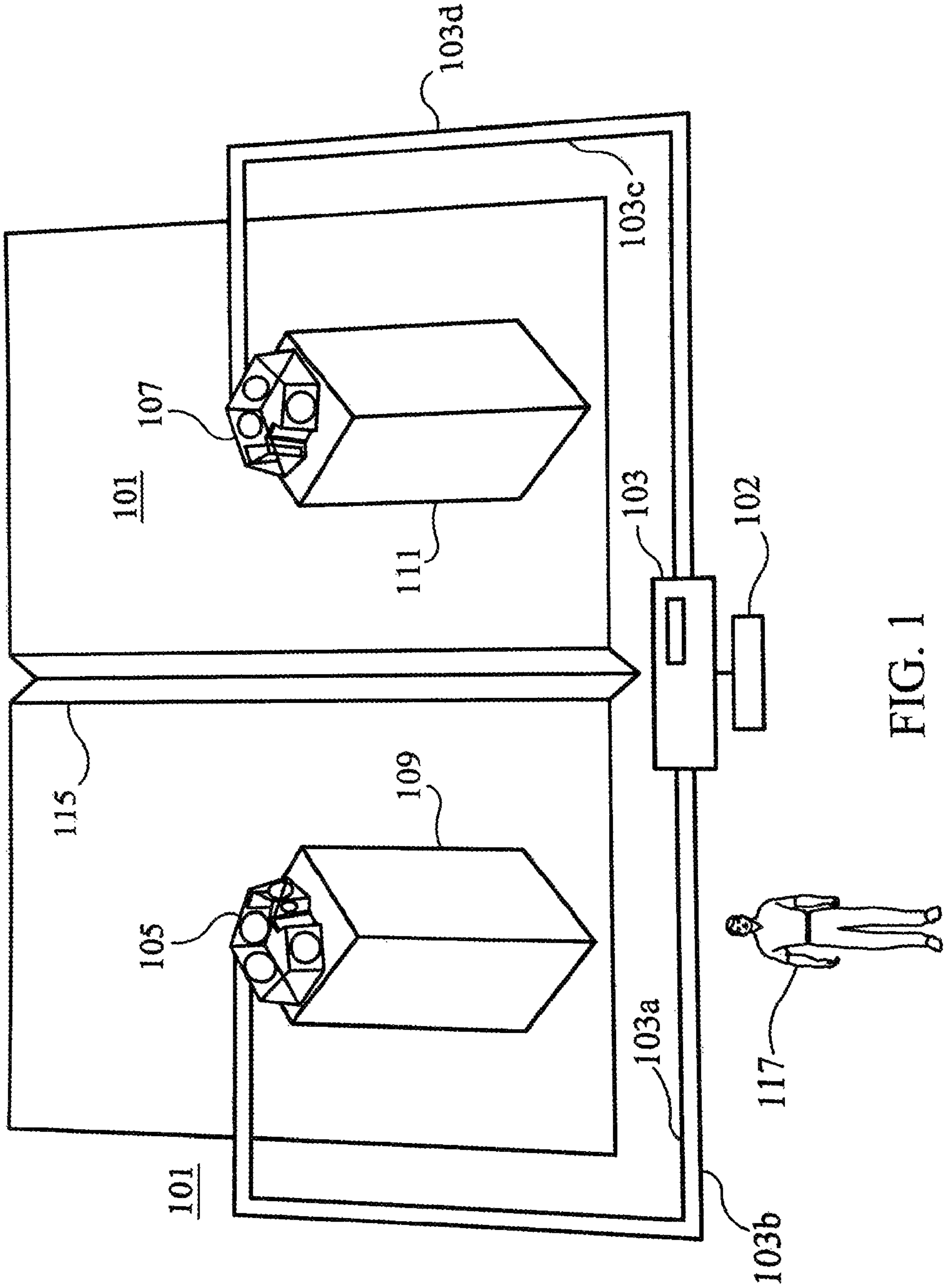
FIG. 1 shows a sound projector system in accordance with the invention.

FIG. 1 is an illustration of a sonic projector speaker system. The Sonic projector system 100 is an ADD on pair of five side cabinets of left cabinet speaker system 105 and a right cabinet speaker system 107 that is designed to rest on respective stand 109 and stand 111 and provide stereo sound throughout the lower middle to the highest frequencies. The front three sides of each cabinet of the left cabinet speaker system 105 and the right cabinet speaker systems 107 are angled to accommodate a lower middle range driver on one angled side, a high frequency speaker in the center, and a mid to upper midrange speaker on the other angled side. The two rear angled sides from the broadest angled panels, and provide a sloping top down to the fronts of the left cabinet speaker system 105 and the right cabinet speaker system 107.

Sonic projector speaker system 100 includes: a screen 101, a sound source 102, an amplifier 103, a left cabinet speaker system 105, a right cabinet speaker system 107, a left floor speaker stand 109, and a right floor speaker stand 111. Sound source 102 may be a radio, DVD player, CD player, MP3 player or a record player. The sound source 102 is connected through the amplifier 103 by lines/wires 103*a* and 103*b* to the left cabinet speaker system 105 in order to transmit sound/music from the sound source 102 through the amplifier 103 to the left cabinet speaker system 105. Also, the sound source 102 is connected through the amplifier 103, which is connected by lines wires 103*c* and 103*d* to the right cabinet speaker system 107 in order to transmit sound/music from the sound source 102 through the amplifier 103 to the right cabinet speaker system 107. Screen 101 is made of Plexiglas that is a hard, slick and rigid surface that is placed horizontally across from the left cabinet speaker system 105, left floor speaker stand 109 and right cabinet speaker system 107 and the right floor speaker stand 111. Left cabinet speaker system 105 sits on the left floor speaker stand 109. Left floor speaker stand 109 and right floor speaker stand 111 may be a stand, cabinet or any device that can respectively hold and support the left cabinet speaker system 105 or the right cabinet speaker system 107. Right cabinet speaker system 107 sits on top of the right floor speaker stand 111.

The distance between the screen 101 and the left cabinet speaker system 105 and the right cabinet speaker system 107 is in the range of 1 to 3 feet. Preferably, the screen 101 is a distance of 1 foot away from the left cabinet speaker system 105 and the right cabinet speaker system 107. The sound source 102 is connected to the amplifier 103 that is utilized to transmit sound/music through the wires 103*a*, 103*b*, 103*c* and

103*d* to the left cabinet speaker system 105 and the right cabinet speaker system 107 to the screen 101.

Screen 101 is a combination of two sheets of four feet (horizontal) by four feet (width) Plexiglas sheets that are placed side by side to provide the total screen 101. Even though the screen 101 includes two four feet by four feet Plexiglas sheets it can range in dimensions from two feet by four feet, 6 feet by 10 feet to 8 feet by 12 feet. The ultimate size of screen 101 is accommodating and dependent upon the size of the room and listening environment. For example, the screen 101 may have dimensions of four feet by eight feet that represents a stage that varies by the size of the room. The screen 101 also has a thickness in the range 0.005-2 inches. Preferably, the screen 101 has a minimum thickness that is three eight of an inch. Also, screen 101 includes an optional vertical triangle 115 that is in the middle of screen 101, which enhances the sound projected from the left cabinet speaker system 105 and the right cabinet speaker system 107.

Figure 6:
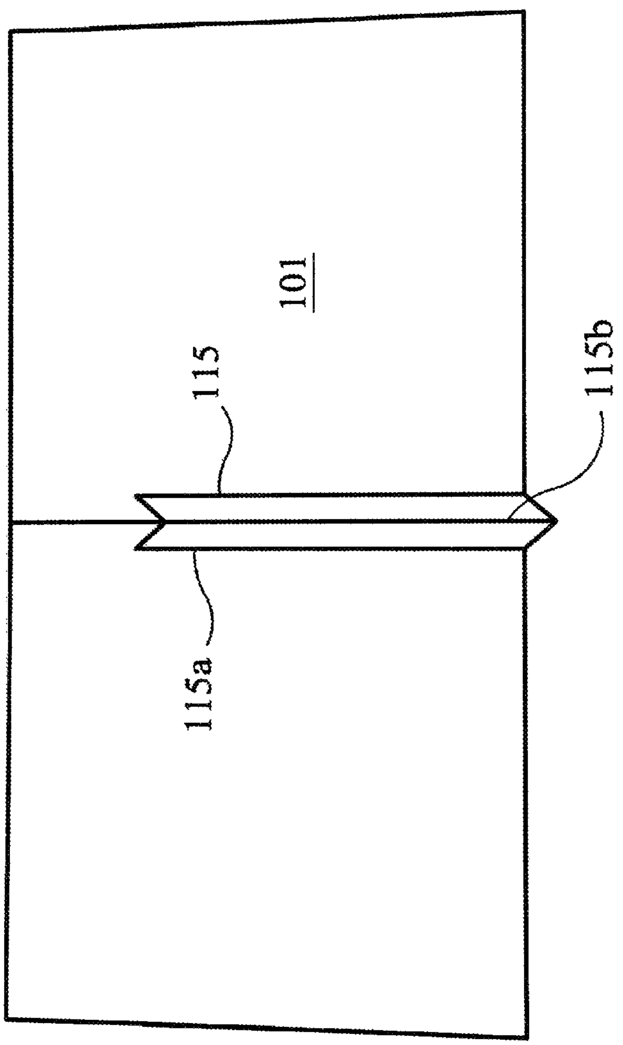
FIG. 6 shows the screen of FIG. 1 in accordance with the invention.

Referring to FIG. 6, optional vertical triangle 115 is a structure formed by two strips 115*a* and 115*b* of Plexiglas sheets. Each of the two strips 115*a* and 115*b* are typically an eighth of an inch thick and each three inches wide and three feet long. One of the long edges of strip 115*a* is hinged to one of the other long edges of the other strip 115*b*. The free, or open sides when attached spread four inches apart to the center of the screen 101, vertically, that forms an appearance of a long acute triangle. The effect of this placement is the augmentation of the sound directed towards the center of the screen 101 by the rear angled speakers of left cabinet speaker system 105 and the right cabinet speaker system 107 housing their respective tweeter and midrange speakers. The optional vertical triangle 115 enhances the sound in the middle of the screen 101 so that there is no hole in the middle so there is no need for a center speaker in the left cabinet speaker system 105 and right cabinet speaker system 107.

Returning to FIG. 1, the sound/music from the optional vertical triangle 115 is distributed to a specific area where a person 117 or listener may be located at a specific coordinated area. The coordinated area may be in the range of 5-10 feet away from the screen 101. This sound from the left cabinet speaker system 105 and the right cabinet speaker system 107 has been augmented by the optional vertical triangle 115 to send a clear sound to the person 117.

Figure 2:
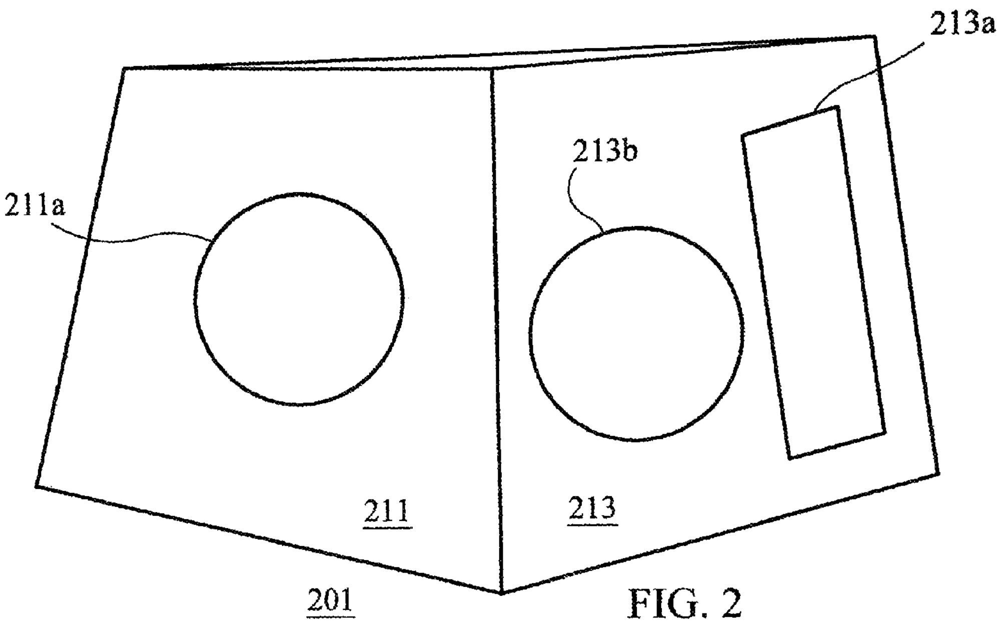
FIG. 2 shows a left cabinet speaker system of FIG. 1 in accordance with the invention.

FIG. 2 shows an illustration of the left cabinet speaker system. Left cabinet speaker system 201 includes: a left rear panel 211 and a right rear panel 213. Left cabinet speaker system 105 is equivalent to left cabinet speaker system 201. Left rear panel 211 includes a midrange speaker 211*a*. Right rear panel 213 includes a tweeter 213*a* with a midrange speaker 213*b* besides it. Tweeter 213*a* and the midrange speaker 213*b* of the right rear panel transmits sound toward the center of the screen 101 (FIG. 1) so the full screen 101 will emit sound.

Figure 3:
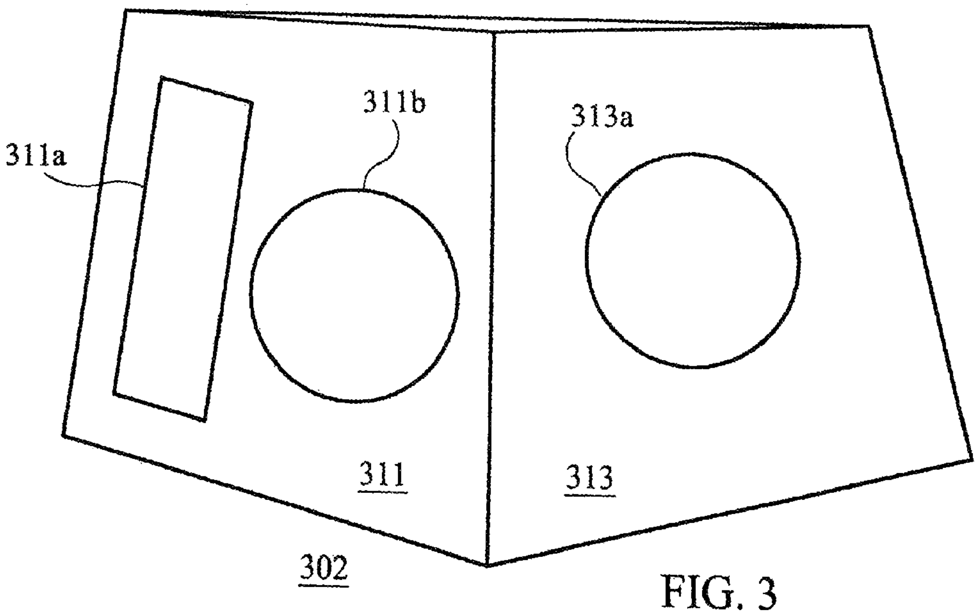
FIG. 3 shows a right cabinet speaker system of FIG. 1 in accordance with the invention.

FIG. 3 shows an illustration of the right cabinet speaker system of FIG. 1. Right cabinet speaker system 301 includes: a left rear panel 311 and a right rear panel 313. Left rear panel 311 includes a tweeter 311*a* on its left with a single midrange speaker 311*b* beside it. Right rear panel 313 has a midrange speaker 313*a*. The tweeter 311*a* and the midrange speaker 311*b* transmit sound toward the center of the screen 101 (FIG. 1) so the full screen 101 will emit sound.

Figure 4:
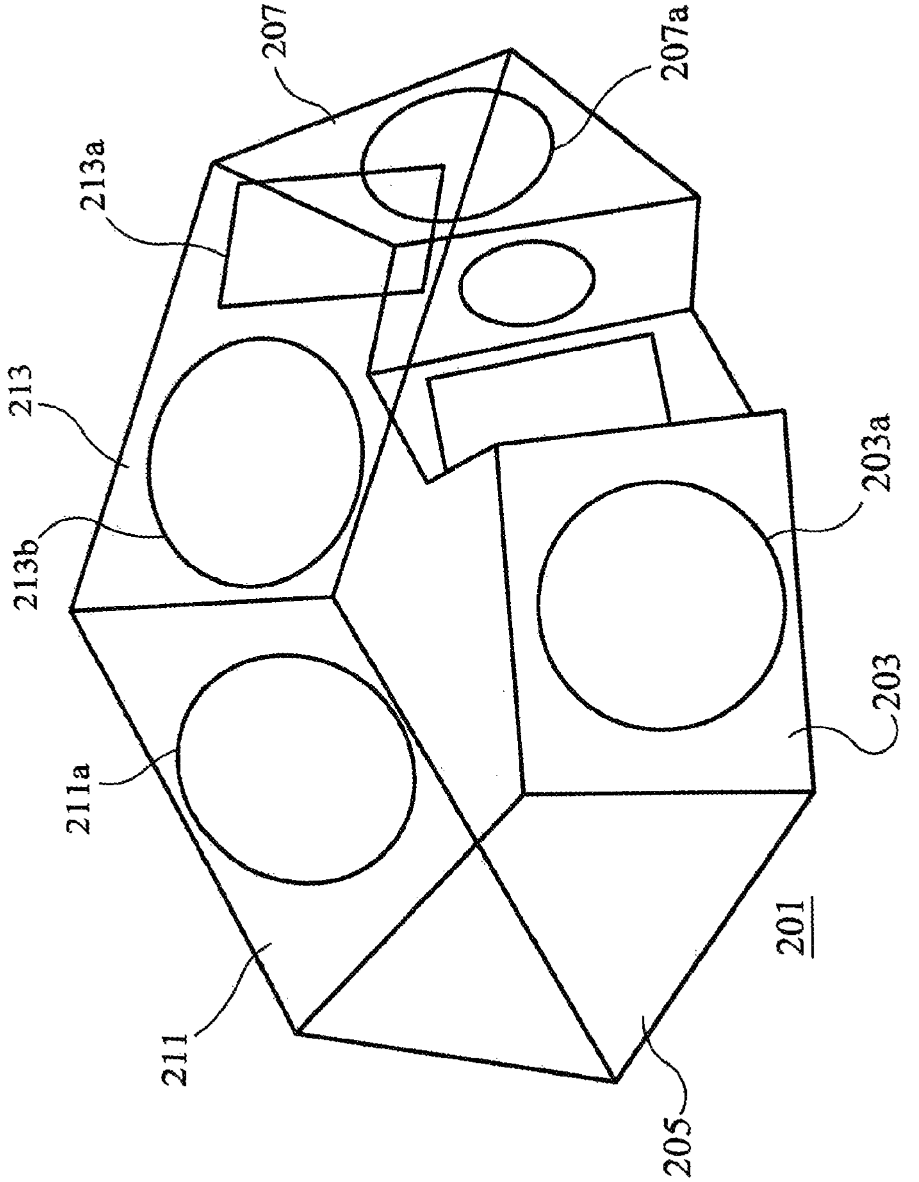
FIG. 4 shows an expanded view of left cabinet speaker system of FIG. 2 in accordance with the invention.

FIG. 4 shows an illustration of an expanded view of the left cabinet speaker system of FIG. 2. Left cabinet speaker system 201 includes: a left front panel 205, a center front panel 203 and a right front panel 207. Left cabinet speaker system 201 is equivalent to left cabinet speaker system 105. Left front panel 205, center front panel 203 and the right front panel 207 are angled to face towards the listener 117 (FIG. 1) in a good or sweet spot towards the center of the listening area toward the listener 117 (FIG. 1). Center front panel 203 includes a high frequency speaker 203*a*. Right front panel 207 includes the upper midrange speaker 207*a*. Left rear panel 211 includes a midrange speaker 211*a* beside it. Right rear panel 213 includes a tweeter 213*a* with a midrange speaker 213*b* besides it. The tweeter 213*a* and the midrange speaker 213*b* transmit sound toward the center of the screen 101 (FIG. 1) so the full screen 101 will emit sound.

Figure 5:
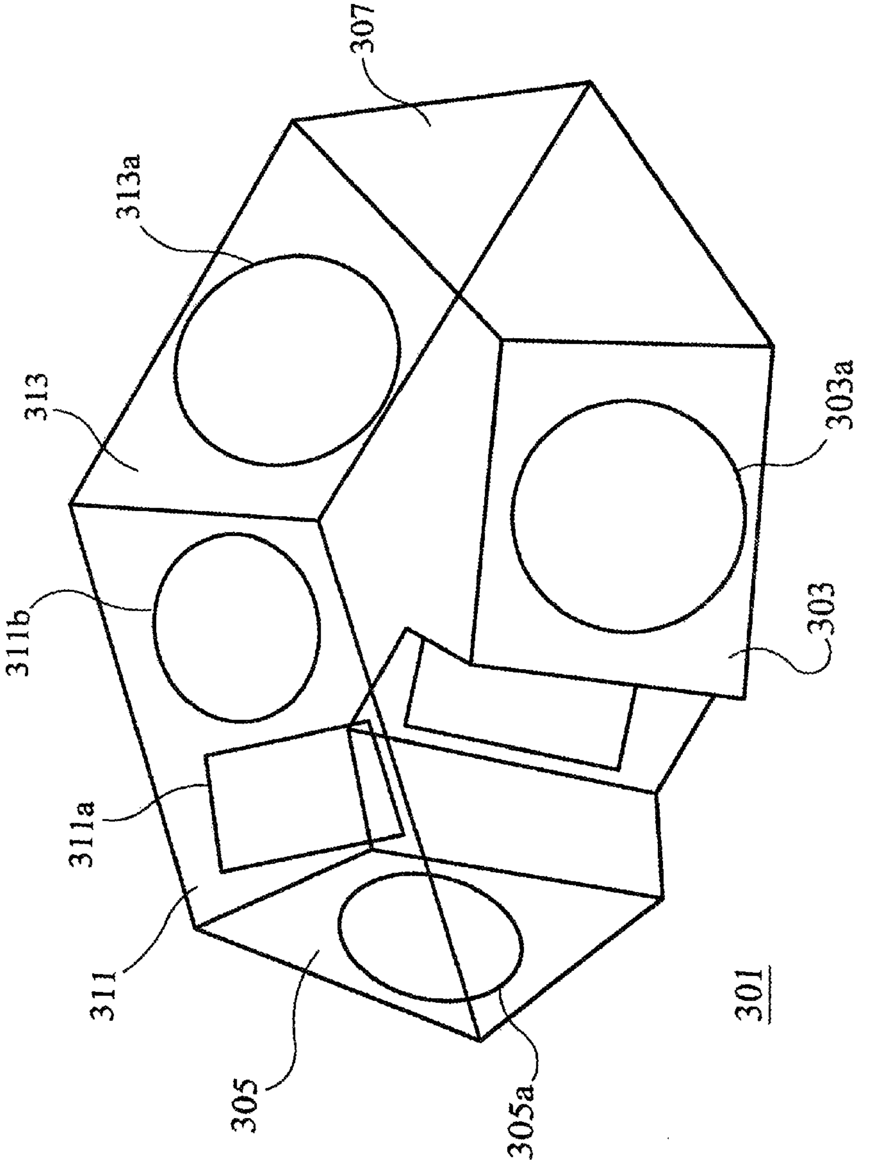
FIG. 5 shows an expanded view of the right cabinet speaker system of FIG. 3 in accordance with the invention.

FIG. 5 shows an illustration of an expanded view of the right cabinet speaker system of FIG. 3. Right cabinet speaker system 301 includes: a left front panel 305, a center front panel 303 and a right front panel 307. Right cabinet speaker system 107 is equivalent to right cabinet speaker system 301. Left front panel 305, center front panel 303 and the right front panel 307 are angled to face towards the listener 117 (FIG. 1) in a good or sweet spot towards the center of the listening area toward the listener 117 (FIG. 1). Left front panel 305 includes lower midrange speaker 305*a*. Center front panel 303 includes a high frequency speaker 303*a*. Left rear panel 311 includes a tweeter 311*a* on its left with a single midrange speaker 311*b* beside it. Right rear panel 313 has a midrange speaker 313*a*. The tweeter and the midrange speaker of the left rear panel 311 transmit sound toward the center of the screen 101 so the full screen 101 would emit sound. The stereo cabinets are dedicated right cabinet speaker system 107 and left cabinet speaker system 105 are not to be interchanged in their positions at any time. The intent and effect is to have the rear panels housing the coupled tweeters respectively 311*a* and 213*a* and the midrange speakers 311*b* and 213*b* of the left cabinet speaker system 105 and the right cabinet speaker system 107 send their sounds towards the center of the screen 101, and the outer rear panels speakers send their sound towards the ends of the screen 101. The full screen 101, thereby, emits sound.

This invention provides a simple sonic projector speaker system. A left speaker cabinet system and a right speaker cabinet system are placed at an angle towards a screen, where the screen is able to control the sound that is dispersed on the screen. The utilization of the screen enables a listener to clearly hear the combined sound emitted from the left speaker cabinet and the right speaker cabinet as if the listener is in an auditorium setting.

What is claimed is:

1. A sonic projector speaker system comprising:

a left speaker cabinet system configured to project sound, wherein the left speaker cabinet system has a rear panel that slopes top down to enhance the projected sound;

a right speaker cabinet system configured to project sound, wherein the right speaker cabinet system has a rear panel that slopes top down to enhance the projected sound; and a screen configured to receive the enhanced projected sound from the left speaker cabinet system and the enhanced projected sound from the right speaker cabinet system, wherein the screen includes a middle portion that receives and transforms the enhanced projected sound from the left speaker cabinet system and the enhanced projected sound from the right speaker cabinet system to a combined enhanced projected sound, wherein the screen is configured to distribute the combined enhanced projected sound to a specific area.

2. The sound projector system of claim 1, wherein the screen is made of Plexiglas.

3. The sound projector system of claim 1, wherein the screen has a hard and slick rigid surface.

4. The sound projector system of claim 1, wherein the left speaker cabinet system is a five-sided cabinet.

5. The sound projector system of claim 1, wherein the right speaker cabinet is a five-sided cabinet.

6. The sound projector system of claim 1, wherein at least one listener is located at the specific area.

7. An enhanced speaker system comprising:

a left speaker cabinet system configured to project sound, wherein the left speaker cabinet system has a rear panel that slopes top down to enhance the projected sound;

a right speaker cabinet system configured to project sound, wherein the right speaker cabinet system has a rear panel that slopes top down to enhance the projected sound; and a screen configured to receive the enhanced projected sound from the left speaker cabinet and the enhanced projected sound from the right speaker cabinet system, wherein the screen includes an optional vertical triangle that receives and augments the enhanced projected sound from the left speaker cabinet system and the enhanced projected sound from the right speaker cabinet system to a combined enhanced projected sound, wherein the screen is configured to distribute the combined enhanced projected sound to a center of a specific area.

* * * * *